US006935466B2

(12) United States Patent
Lubomirsky et al.

(10) Patent No.: US 6,935,466 B2
(45) Date of Patent: Aug. 30, 2005

(54) LIFT PIN ALIGNMENT AND OPERATION METHODS AND APPARATUS

(75) Inventors: Dmitry Lubomirsky, Cupertino, CA (US); Sheshraj Tulshibagwale, Cupertino, CA (US); Donald Olgado, Palo Alto, CA (US); Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 850 days.

(21) Appl. No.: 09/797,459

(22) Filed: Mar. 1, 2001

(65) Prior Publication Data

US 2002/0121312 A1 Sep. 5, 2002

(51) Int. Cl.[7] ............................................. H01L 21/00
(52) U.S. Cl. ...................... 187/250; 414/757; 414/217; 414/804; 414/935; 118/724; 118/728; 156/345.54
(58) Field of Search .......................... 414/217, 217.1, 414/804, 935, 939, 757; 187/250, 272, 275; 118/724, 728; 156/345.51, 345.54

(56) References Cited

U.S. PATENT DOCUMENTS

| | | |
|---|---|---|
| 5,150,040 A | 9/1992 | Byrnes et al. |
| 5,484,011 A | 1/1996 | Tepman et al. |
| 5,820,723 A * | 10/1998 | Benjamin et al. ...... 156/345.51 |
| 5,848,670 A | 12/1998 | Salzman |
| 5,879,128 A | 3/1999 | Tietz et al. |
| 5,886,864 A | 3/1999 | Dvorsky |
| 5,967,030 A * | 10/1999 | Blalock .................... 156/583.3 |
| 6,120,609 A | 9/2000 | Selyutin et al. |
| 6,146,504 A * | 11/2000 | Patadia et al. ............... 118/728 |
| 6,231,716 B1 * | 5/2001 | White et al. ................. 187/250 |
| 6,423,947 B2 * | 7/2002 | Womack et al. ............ 118/724 |
| 6,537,011 B1 * | 3/2003 | Wang et al. ................ 414/217 |

FOREIGN PATENT DOCUMENTS

| | | |
|---|---|---|
| EP | 0129732 | 1/1985 |
| EP | 0623947 | 11/1994 |
| EP | 0793262 | 9/1997 |
| EP | 0809278 | 11/1997 |
| EP | 0867773 | 9/1998 |
| EP | 0966025 | 12/1999 |
| JP | 6252062 | 9/1994 |
| WO | 0028581 | 5/2000 |

OTHER PUBLICATIONS

Humphrey Products Co., "Cylinder Joints," published prior to Mar. 1, 2001; 4 pages.
PCT/US02/06387 International Search Report dated Aug. 30, 2002.

* cited by examiner

*Primary Examiner*—Kathy Matecki
*Assistant Examiner*—Thuy V. Tran
(74) *Attorney, Agent, or Firm*—Konrad, Raynes & Victor

(57) ABSTRACT

A lifting mechanism includes a plurality of lift pins which may be driven separately and independently upward to engage an alignment surface of the chamber using ambient atmospheric pressure as the chamber is evacuated by a pump. In the illustrated embodiment, each lift pin includes a piston which is exposed to the internal chamber pressure on one side of the piston, and is exposed to the external ambient pressure on the other side of the piston. As the pump evacuates the chamber, the internal chamber pressure decreases, causing each lift pin piston to drive the associated lift pin upward. Once all the lift pins have securely engaged the alignment surface, the lift pins may be clamped to a linking mechanism to permit a motor to actuate the lift pins during processing operations.

8 Claims, 8 Drawing Sheets

LIFT PIN ALIGNMENT AND OPERATION METHODS AND APPARATUS

DESCRIPTION

The present inventions relate to methods and apparatus for lifting a workpiece from the surface of a workpiece support in a semiconductor processing system, and to methods and apparatus for aligning lifting apparatus in a semiconductor processing system.

A conventional semiconductor processing system contains one or more chambers including processing and transfer chambers, within which a wafer is supported by a pedestal or other workpiece support. One example of a pedestal is a heater plate in an annealing chamber in which the heater plate heats a semiconductor wafer which is supported on the plate. The wafer or other semiconductor workpiece is typically transported into the chamber through a slit valve by a transport robot which positions the wafer above the pedestal. A lift mechanism which often includes a plurality of lift fingers, is raised within the chamber until the lift fingers engage the underside of the wafer and lift the wafer from the robot arm. After the robot arm is withdrawn from the chamber, the lift mechanism, typically under control of a computer control system, then lowers the lift fingers below the pedestal so that the wafer is placed onto the surface of the pedestal After the wafer is placed onto the support surface of the pedestal, the lift fingers typically continue to descend into the pedestal to a fully retracted position. The wafer is usually chucked by a mechanical or electrostatic chuck which clamps or chucks, the wafer to the pedestal. Then one or more semiconductor fabrication process steps are performed in the chamber, such as annealing the wafer or depositing or etching films on the wafer. After completion of the process steps, the lift mechanism extends the lift fingers to raise the wafer above the pedestal so that the wafer can be removed from the chamber via the robotic transport.

However, some chambers including anneal chambers often include a cooling plate positioned above the pedestal to cool the wafer prior to removing the wafer from the chamber. The lift mechanism may be used to lift the wafer from the pedestal following annealing or other processes which heat the wafer, and to position the wafer adjacent to the cooling plate to facilitate cooling of the wafer prior to removal of the wafer from the chamber. In many such chambers, it is preferred that the wafer not actually touch the cooling plate since such may damage the processed wafer surface. Accordingly, the actuation of the lift fingers is typically carefully controlled to avoid contact between the wafer and the cooling plate. To facilitate such control, the lift fingers are usually aligned with respect to a chamber interior surface to provide a baseline or "zero" location for the lift mechanism control system.

FIGS. 7–9 show an example of an upper assembly 10 of a prior art lift mechanism which has six lift fingers 12 arranged around a hoop 14. Each lift finger 12 has a fingertip 16 which engages the underside of a wafer (not shown) as the hoop 14 is lifted by the lift mechanism. In this manner, the wafer may be lifted up, either to be picked up by a robot blade or alternatively to be positioned immediately below a cooling plate for cooling prior to pick up by the robot. The lift hoop 14 is attached at one end to the top end 18 of a shaft 20 which in turn is journaled within a flange 22 which permits the shaft 20 to slide vertically within the flange 22. A bellows 24 welded to the top 18 of the shaft 20 and to the flange 22 provides a flexible, pressure-tight enclosure to inhibit the passage of outside atmospheric gases into the interior of the chamber when the upper assembly 10 is installed in the chamber. Housing portions 26a and 26b are secured around the bellows 24 and flange 22 as best seen in FIG. 8 which shows the lift mechanism assembly upside down.

To align the lift mechanism to the cooling plate 30 of the chamber, a technician fastens the lift mechanism upper assembly 10 to the underside of the chamber lid 32 as shown in FIG. 8. In this position, the hoop 14 is centered on and surrounds the cooling plate 30. The chamber lid is then placed on the chamber 40 (FIG. 9) with the shaft 20 of the upper assembly 10 extending through an aperture in the bottom wall 42 of the chamber 40. A flange cover 44 is fastened to the upper assembly 10 to secure it to the bottom wall 42 of the chamber. The bottom end 50 of the shaft 20 of the upper assembly 10 is received in a gimbal assembly 52 which attaches the shaft 20 to a linear guide 60. The gimbal assembly 52 can accommodate in three dimensions, a degree of nonalignment between the shaft 20 and the linear guide 60. The hoop 14 of the upper assembly 10 may then be unfastened from the chamber lid 32. In this position, the hoop 14 carrying the lift fingers 12 is in the "zero" vertical position. A motor 62 acting through the linear guide 60 and gimbal assembly 52, drives the shaft 20 and hence the hoop 14 and lift fingers 12 up and down.

Following alignment, the chamber 30 may be pumped down to the desired processing vacuum pressure by a pump 64 which evacuates the chamber 30 through an exhaust line 66. The pump 64, the lift motor 62 and other controllable components of the processing system are usually controlled by a system controller 70 which is typically a programmed workstation. To cool a wafer, the lift fingers 12 may be positioned by the system controller 70 at a vertical location offset from the zero location such that the wafer has the desired spacing from the cooling plate.

The following is a description of a specific embodiment of the inventions, reference being made to the accompanying drawings, in which.

Figure 1:
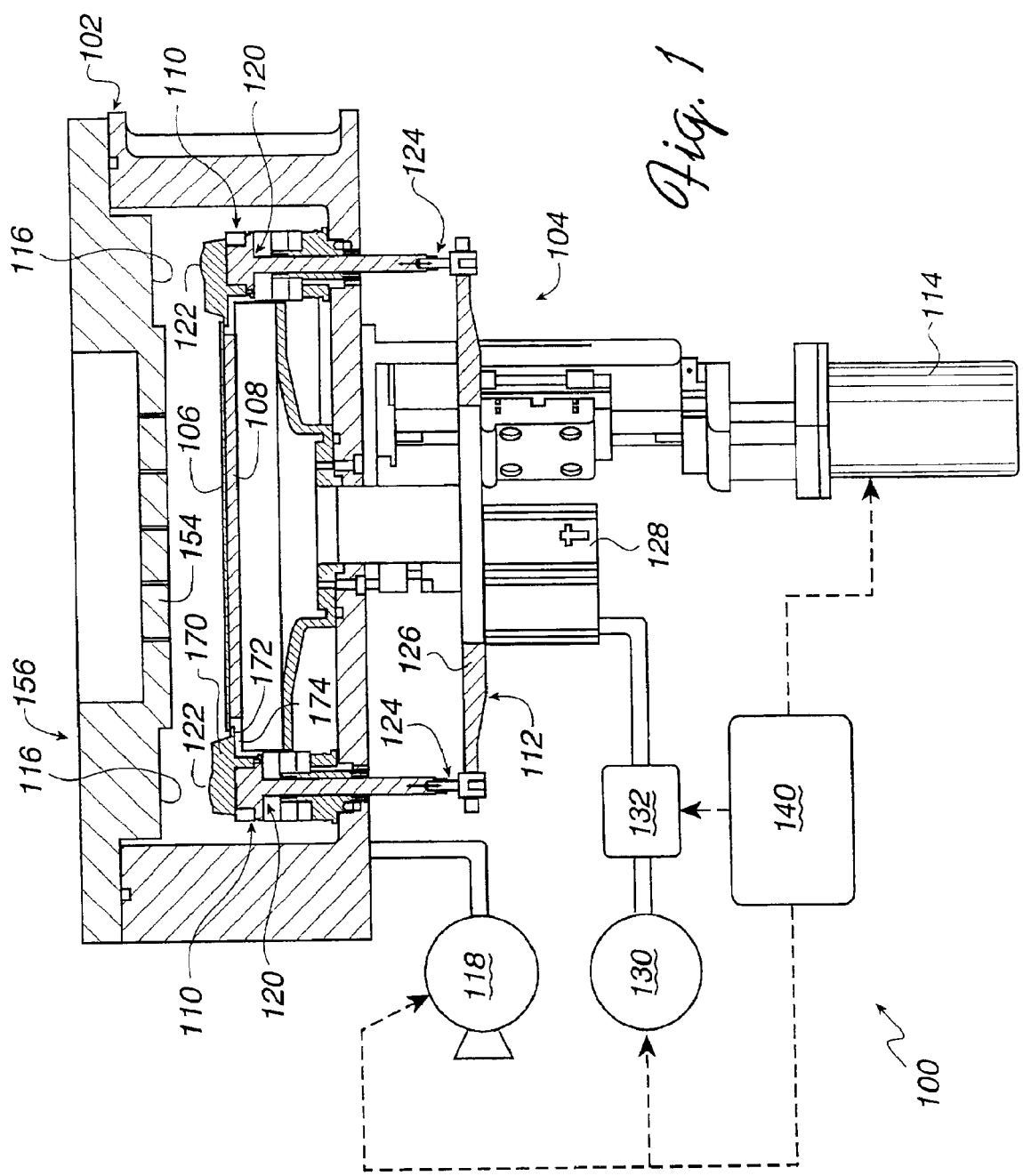
FIG. 1 is a schematic drawing of a semiconductor processing system in accordance with one embodiment of the present inventions, the drawing including a cross-sectional view of the chamber and lifting mechanism of the system of FIG. 1 as seen along the lines 1—1 of FIG. 2.
Figure 2:
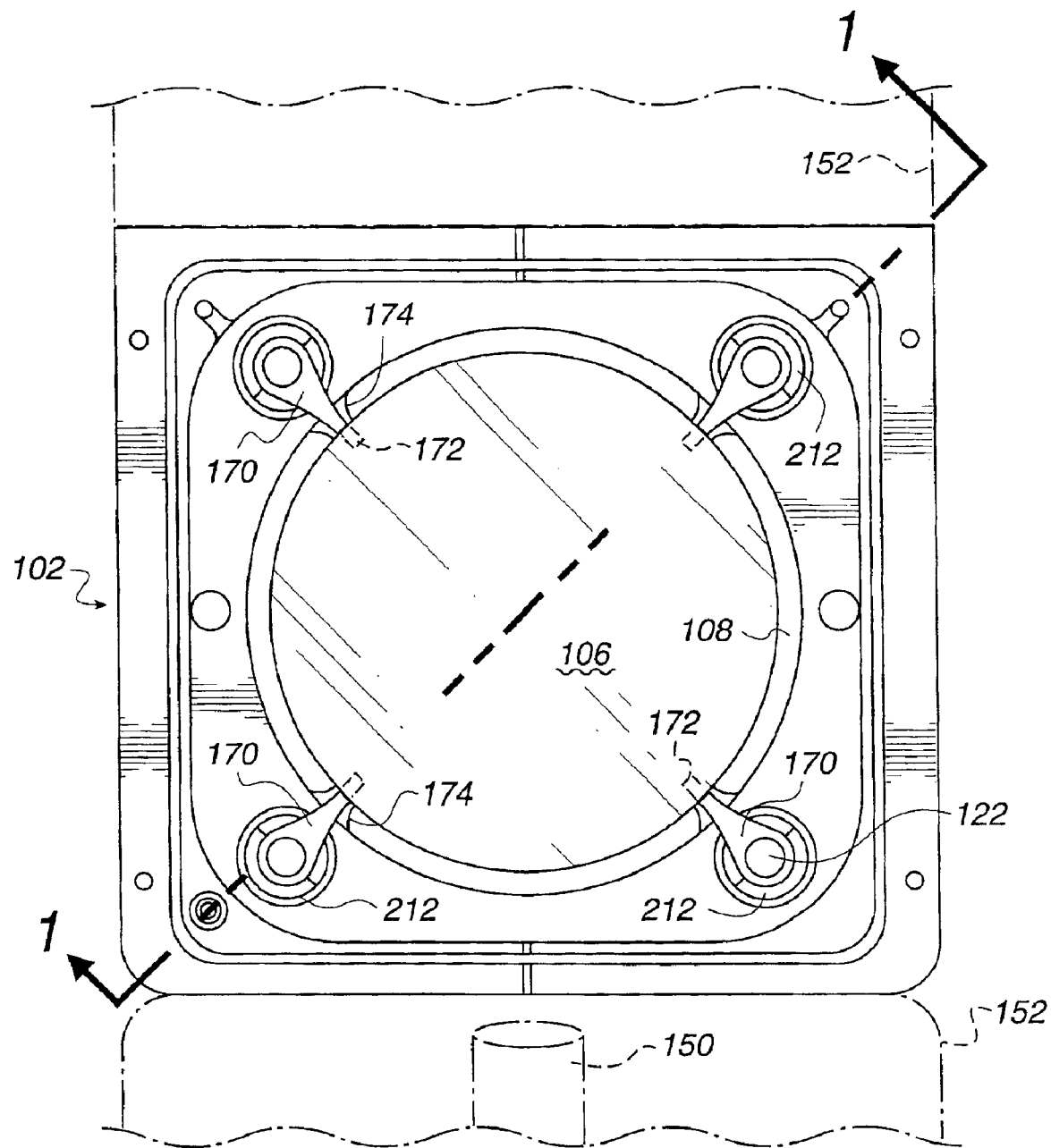
FIG. 2 is a top view of the chamber of FIG. 1 with the chamber lid removed.
Figure 3:
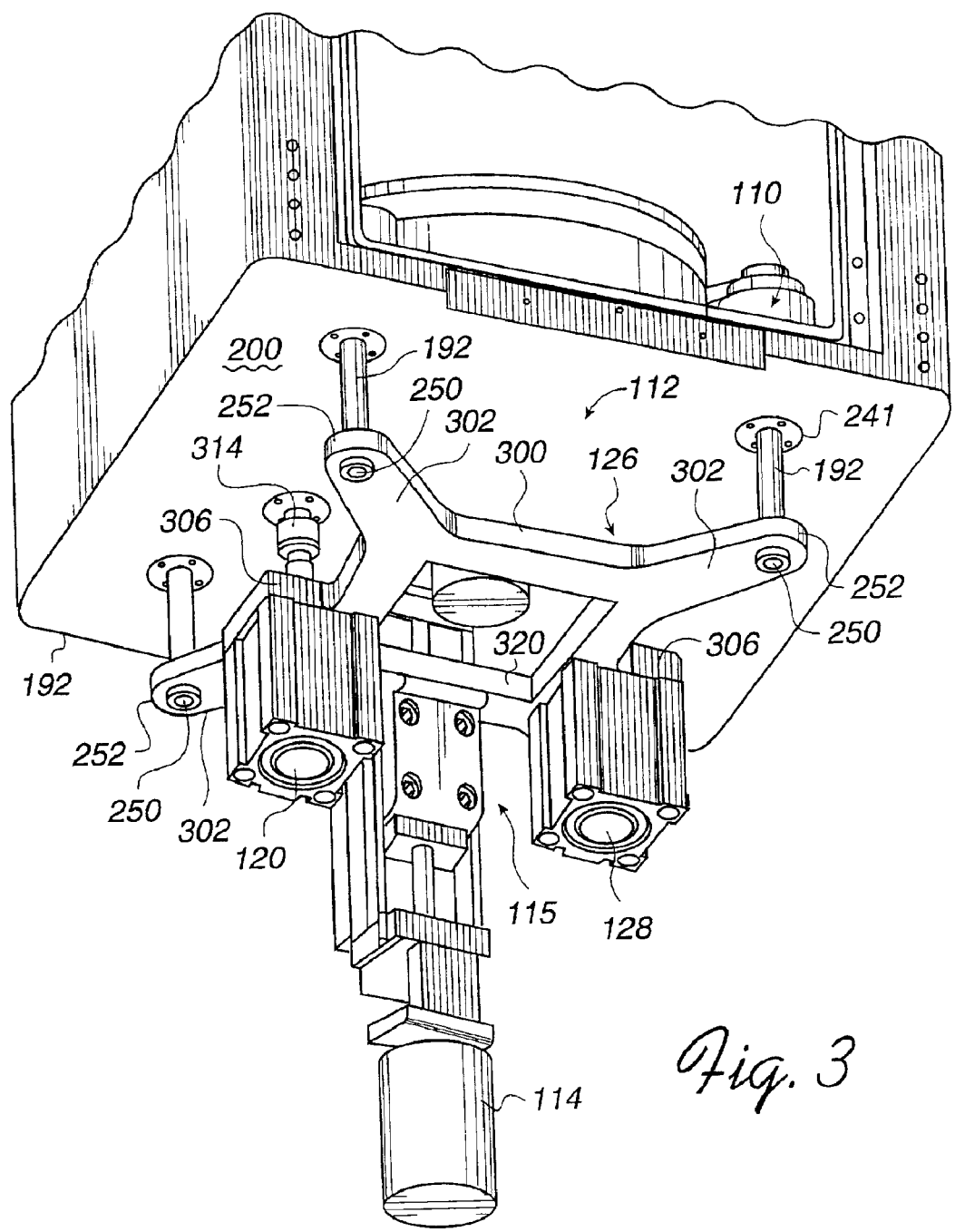
FIG. 3 is a partial perspective view of the lower portion of the chamber and lifting mechanism of FIG. 1.
Figure 4:
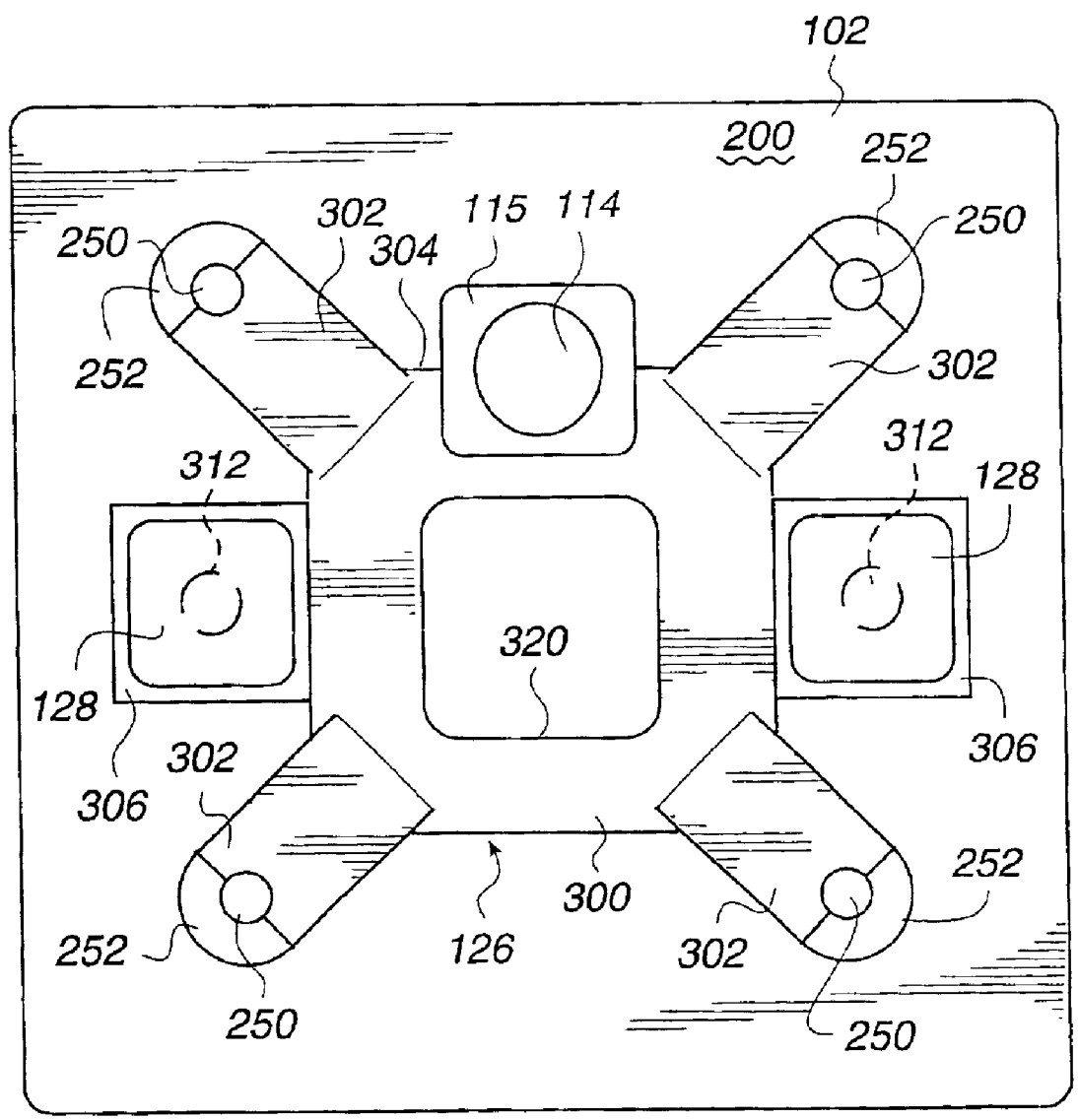
FIG. 4 is a schematic drawing of a bottom view of the lifting mechanism and chamber of FIG. 3.

A semiconductor processing system in accordance with one embodiment of the present invention is indicated generally at 100 in FIG. 1. The processing system 100 includes a processing chamber 102 which has a lift mechanism 104 which lifts a wafer 106 (FIG. 2) or other workpiece from a workpiece support 108. To lift a wafer, the lift mechanism 104 has a plurality of lift pins 110 which engage the underside of the wafer as the lift pins 110 are raised. During normal processing operations, the lift pins 110 are normally linked together by a linking mechanism 112 (FIGS. 3, 4). A motor 114 coupled through a linear guide 115 to the linking mechanism, raises and lowers the linked lift pins 110 in unison. However, in accordance with one aspect of the present inventions, as explained in greater detail below, the lift pins 110 (FIGS. 5a, 5b, 6) are preferably not linked together by any linking mechanism during an initial alignment procedure. Instead, each of the lift pins 110 may be driven separately and independently upward to engage an alignment surface 116 (FIG. 6) of the chamber using ambient atmospheric pressure as the chamber 102 is evacuated by a pump 118.

In the illustrated embodiment, each lift pin 110 includes a piston 120 which is exposed to the internal chamber pressure on one side of the piston 120 (FIG. 5a), and is exposed to the external ambient pressure on the other side of the piston. As the pump 118 evacuates the chamber 40, the internal chamber pressure decreases, causing each lift pin piston 120 to drive the associated lift pin upward. Once all the lift pins 110 have securely engaged the alignment surface, the lift pins 110 may be clamped to the linking mechanism 112 to permit the motor 114 to actuate the lift pins 110 during processing operations. In this manner, each of the lift pins 110 of the lift mechanism 104 may be independently aligned to the alignment surface 116 for subsequent processing operations.

In another aspect of the present inventions, each lift pin 110 has a curved engagement surface 122 positioned to engage the chamber alignment surface 116. In the illustrated embodiment, and as best seen in FIG. 6, the lift pin engagement surface 122 is preferably spherical to inhibit damage to the alignment surface as a result of angular displacement of the lift pin 110.

Figure 6:
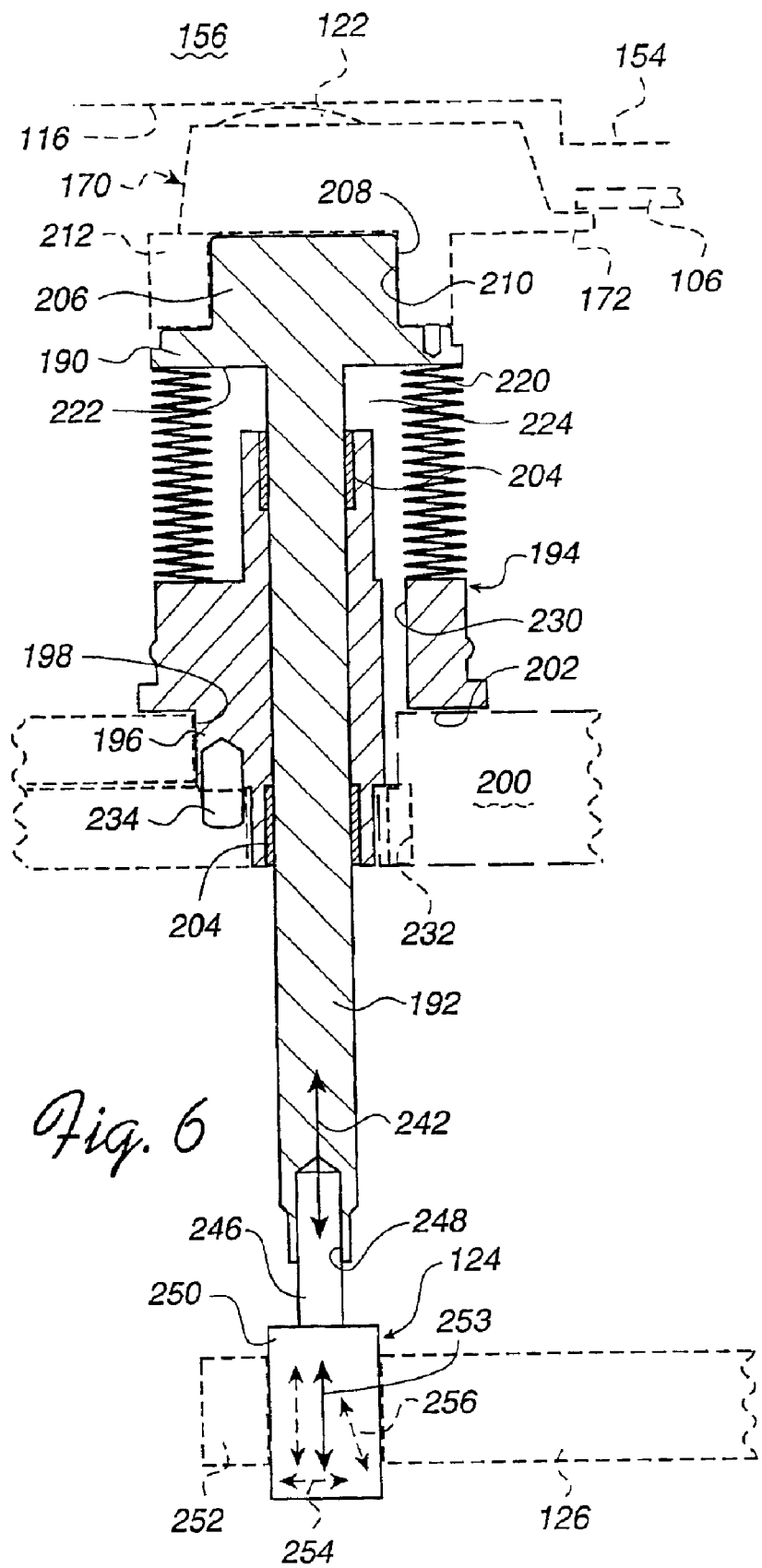
FIG. 6 is a partial cross-sectional view of the lift pin subassembly of FIG. 5b as viewed along the line 6—6, and shown installed in the upper portion of the lift mechanism of FIG. 1.
Figure 8:
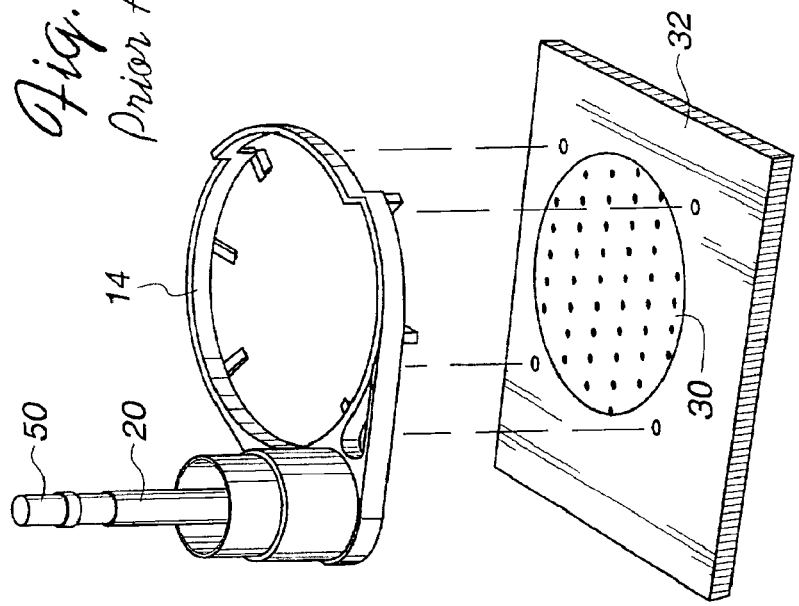
FIG. 8 illustrates the upper portion of the lift mechanism of FIG. 7 being attached to a chamber lid in accordance with a prior art procedure for aligning the prior art lifting mechanism.
Figure 7:
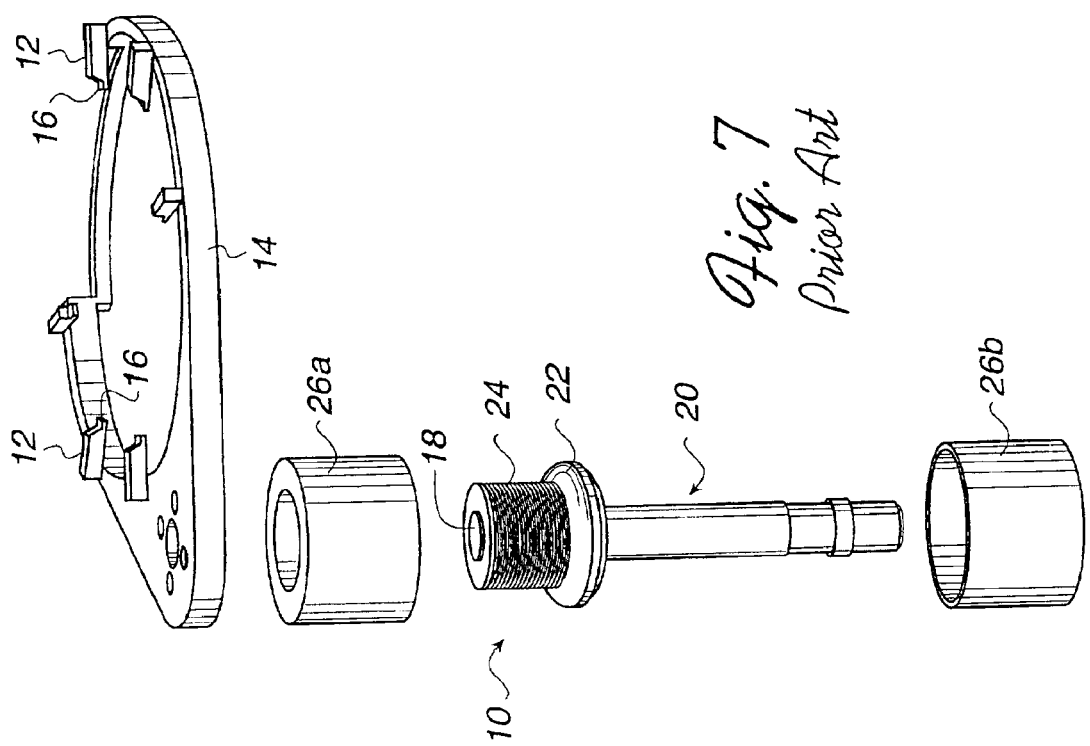
FIG. 7 is an exploded perspective view of the upper portion of a prior art lift mechanism.
Figure 9:
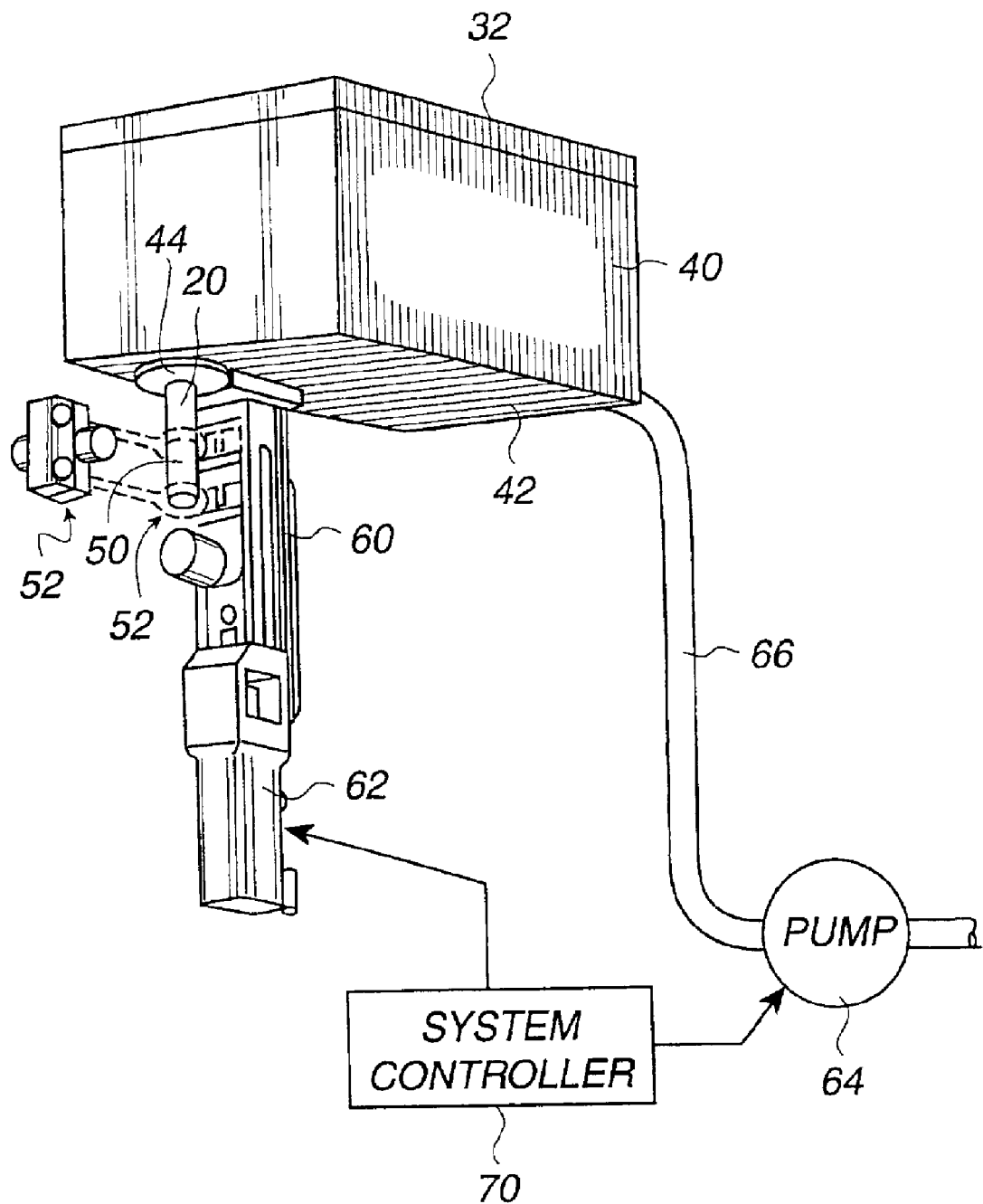
FIG. 9 is a schematic drawing of a prior art semiconductor processing system, the drawing including a perspective view of a prior art chamber and prior art lifting mechanism which includes the prior art chamber lid and lifting mechanism upper portion shown in FIG. 8.

In yet another aspect of the present inventions, the linking mechanism 112 includes a plurality of floating joints 124, each of which, as best seen in FIGS. 4, 6, couples a linking member 126 of the linking mechanism 112 to one of the lift pins 110. As explained in greater detail below, each float joint relieves stress in both the angular as well as lateral directions to accommodate a substantial degree of angular and eccentric misalignment between the motion of the linking member 126 and each of the motions of the various lift pins 110.

In still another aspect of the present inventions, the lift mechanism 104 further includes one or more pressure cylinders 128 coupled to the linking mechanism 112. As noted above, each piston 120 of the lift pins 110 provides an upward force as a result of the net pressure differential between the internal chamber pressure and the ambient atmospheric pressure external to the chamber. After the initial alignment procedure and the lift pins 110 are coupled to the linking mechanism 112, this upward force produced by the ambient atmospheric pressure on the lift pins 110 is opposed by the motor 114, particularly when the motor 114 is directed to lower the lift pins 110. To counter-balance the upward force produced by the ambient atmospheric pressure on the lift pins 110, a pump 130 can provide air or other fluid under pressure to the pressure cylinders 128 to produce a downward directed force on the linking mechanism 112. The magnitude of the downward force can be controlled by controlling the pressure of the fluid supplied to the pressure cylinders 128. In the illustrated embodiment, a pressure regulator 132 controlled by the system controller 140 maintains the pressure to the pressure cylinders 128 substantially constant at a first value such as 10 p.s.i. (0.7 kilogram-force per square centimeter ($kgf/cm^2$)), for example, when raising the lift pins 110. Conversely, the pressure is maintained substantially constant at a second value, such as 20 p.s.i. (1.4 $kgf/cm^2$) for example, which is higher than that of the first pressure value, when lowering the lift pins.

In the illustrated embodiment, the processing chamber 102 is an anneal chamber which treats the wafer 106 by heating it to a prescribed temperature for a prescribed length of time. The wafer is heated by the pedestal 108 which includes a heater plate on which the wafer rests in the chamber 102. Because some wafers are subject to oxidation, particularly at high temperatures, in some applications it is preferred to anneal the wafer in an oxygen free atmosphere in the chamber. For example, a wafer having a deposited copper film may be heated to 100 to 600 degrees C. Upon completion of the anneal process, the wafer may be transferred by a robot 150 in an adjoining transfer or buffer chamber 152 (FIG. 2) to another processing chamber of the processing system 100. If the transfer chamber 152 or the robot 150 transfers the wafer in an atmosphere such as the ambient atmosphere which contains oxygen, it may be preferable in some systems to first cool the wafer 106 in the anneal chamber 102 prior to transferring the wafer to other chambers. Accordingly, the anneal chamber 102 has a cooling plate 154 disposed above the pedestal heating plate 108. In the illustrated embodiment, the cooling plate 154 is formed as a part of the chamber lid 156.

In order to cool the wafer following annealing, the lift mechanism 104 lifts the wafer 106 from the pedestal heating plate 108 and moves the wafer 106 to an upper position adjacent to the cooling plate 154. In many applications, it is appropriate to bring the upper surface of the wafer close to the cooling plate to facilitate heat transfer from the wafer to the cooling plate. However, it is often preferred that the upper surface of the wafer not actually touch the cooling plate because the cooling plate may scratch or otherwise damage the deposited films on the wafer. Thus, in many applications it is desirable to closely control the spacing between the wafer and the cooling plate. For example, a parallel spacing of as little as 0.5 mm to 1 mm between the upper surface of the wafer and the lower surface of the cooling plate may be appropriate in some applications. As will be made more clear below, a lift mechanism and alignment procedure in accordance with the present inventions are believed to facilitate precise control of the spacing between the wafer and the cooling plate, which spacing may be maintained over many wafer cooling operations.

To lift a wafer from the pedestal 108, the lift pins 110 of the lift mechanism 104, each have a lift finger 170 which is carried by the piston 120 of each lift pin 110. Each lift finger 170 in turn has a finger tip 172 which is positioned to engage the underside of the perimeter of the wafer 106. When the lift pins 110 are positioned in a fully retracted position as shown in FIGS. 1 and 2, the lift finger tips 172 are received in recesses 174 in the pedestal 108. In this retracted position, the lift finger tips 172 are positioned below and spaced from the perimeter of the wafer 106. As the lift pins 110 are raised, the lift finger tips 172 engage the underside of the wafer 106, lifting the wafer from the pedestal 106. In this manner, the lift pins 110 may lift the wafer to a cooling position close to the cooling plate 154 or to an intermediate raised transfer position at which the robot 150 may lift the wafer off the lift pins 110 and transfer the wafer to another chamber.

Figures 5A, 5B:
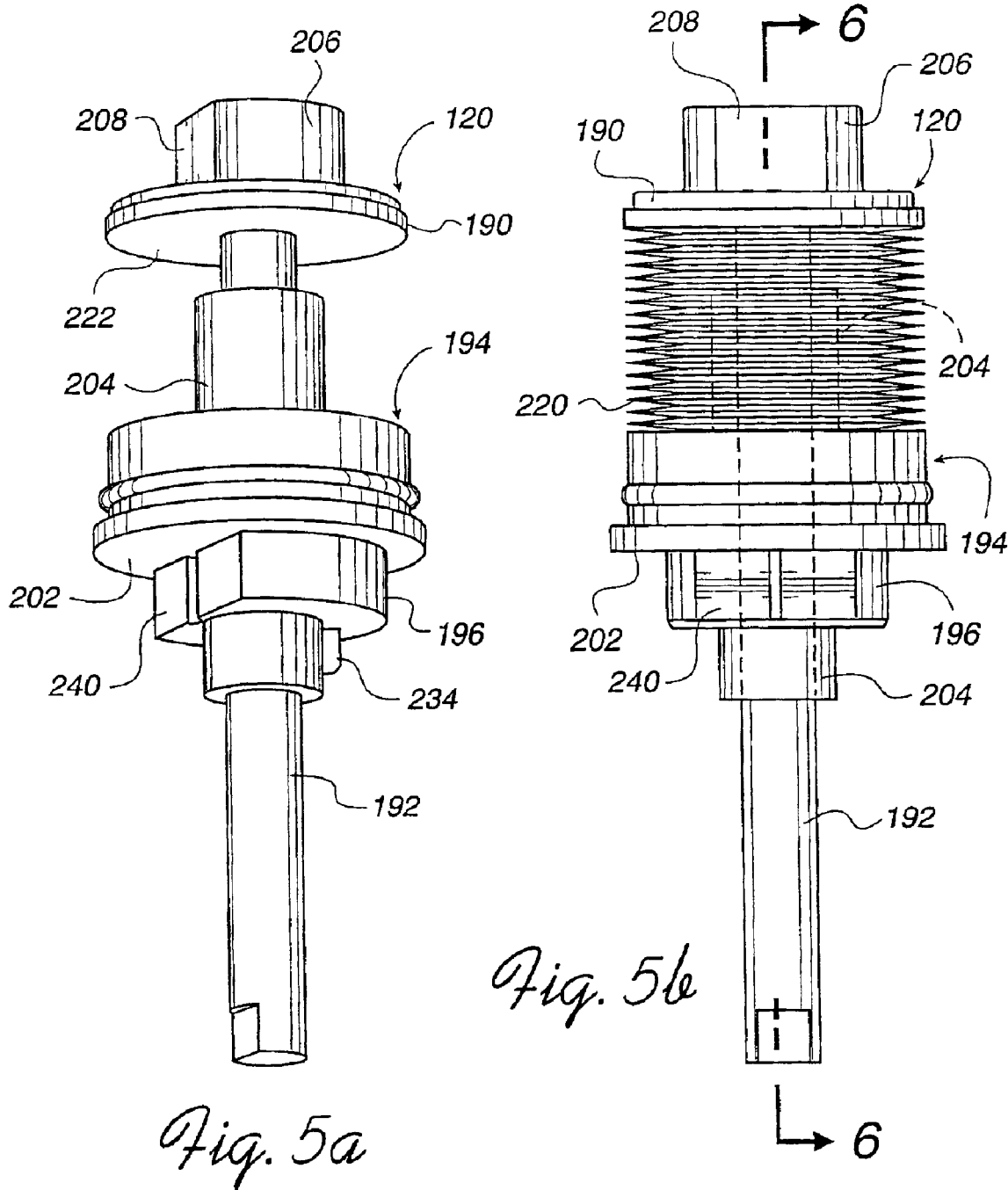
FIG. 5a is a perspective view of a lift pin subassembly of the lift mechanism of FIG. 1.
FIG. 5b is a front view of the lift pin subassembly of FIG. 5a shown with an added bellows.

FIGS. 5a, 5b and 6 show the piston 120 of the lift pins 110 in greater detail. As shown therein, each piston 120 includes a flange-shaped piston head 190 and a piston shaft 192 extending below the piston head 190. The piston shaft 192 vertically slides within a flange member 194 having a barrel portion 196 which is received in an aperture 198 in the bottom floor 200 of the processing chamber 102. A shoulder 202 of the flange member 194 is carried by the top surface of the chamber floor 200. The flange member 194 guides the vertical movement of the piston shaft 192 and has a pair of bushings 204 which facilitate the piston shaft 192 sliding within the flange member.

Above the piston head 190 of the piston 120 is a generally cylindrically-shaped base portion 206 which carries a lift finger 170. The base portion 206 has a flat registration surface 208 which engages a similarly shaped registration surface 210 of the lift finger 170 to align the lift finger with respect to the piston 120 so that the lift finger tip 172 is oriented radially inward toward the wafer position as shown in FIG. 2. In the illustrated embodiment, the lift finger 170 is clamped to the base portion 206 of the piston 120 by a semi-circular shaped clamp 212. Other types of releasable couplers and fasteners may be used as well.

The lift pin 110 further includes a bellows 220 which is welded and sealed to the piston head 190 at one end, and welded and sealed to the lift pin flange member 194 at the other end of the bellows. The bellows 220 defines a piston chamber 224 on the underside 222 of the piston head 190. The flange member 194 defines a channel 230 which is aligned with a corresponding channel 232 in the bottom floor 200 of the chamber 102. The channels 230 and 232 vent the piston chamber 224 to the exterior of the chamber 102 so that the piston chamber 224 and hence the underside 222 of the piston head 190 are exposed to the ambient atmospheric pressure exterior to the chamber 102.

An alignment pin 234 extending from the bottom of the flange member 194 is received in a corresponding recess in the chamber bottom floor 200 to align the channels 230 and 232 and also the angular orientation of the lift pin 110 in general. To facilitate alignment between the piston 120 and the flange member 194 of each lift pin 110 as the bellows 220 is welded to the piston and flange member, the flange member 194 has a flat surface 240 on which the flange member 194 may rest on a support surface during the welding operation. The base portion registration surface 208 of the piston 190 may rest on a support surface with the lift finger 170 removed. In this manner, a desired orientation between the piston 120 and the flange member 194 may be maintained as the bellows 220 is welded to these members. It is recognized that other techniques for permanently attaching the bellows to the piston and flange member may be used as well.

The lift finger 170 may then be clamped to the base portion 206 of the piston 120 and the lift pin 110 installed into the chamber in the angular alignment orientation discussed above. Each lift pin may be fastened to the bottom wall 200 of the chamber using fasteners 241 which pass through the bottom wall 200 as shown in FIG. 3 and are threaded into the flange member 194 of the lift pin. It is recognized that the lift pins 110 may be fastened to the chamber using other types of fasteners. In addition, suitable vacuum seals may be used to seal the flange/chamber wall interface such as between the flange member shoulder 202 and the upper surface of the chamber bottom wall 200.

During normal processing operations in which the lift mechanism 104 is used to raise and lower wafers for processing and transfer, the lift pins 110 are normally linked together by attachment to the linking member 126 of the linking mechanism 112 so that the motor 114 can lift raise and lower the lift pins in unison. However, during an initial alignment procedure, the lift pins 110 are preferably disconnected from the linking mechanism 104 so that each lift pin 110 is free to vertically slide independently of the other lift pins 110. As previously mentioned, the piston chamber 224 of each lift pin is exposed to ambient atmospheric pressure. In accordance with one aspect of the present inventions, each lift pin may be raised independently, using the ambient atmospheric pressure, to align each lift pin independently. This may be achieved by activating the pump 118 (FIG. 1) to begin evacuating the chamber 102 after the lift pins 110 are installed in the chamber and the chamber is made into a pressure-tight enclosure by securing the lid 156 to the top of the chamber and closing any other openings to the chamber 102.

The internal chamber pressure exerts a downward force on each lift pin 110 including the piston head 190. In addition, gravity exerts a downward force on the lift pins 110. Conversely, the ambient atmospheric pressure in the piston chamber exerts an upward force on the piston head 190 of each lift pin 110. In the illustrated embodiment, the lift pins when first installed are at an initial position above the retracted position illustrated in FIGS. 1 and 2. As the pump 118 evacuates the interior of the chamber 102, the internal pressure of the chamber declines. Once the upward pressure exerted by the ambient atmospheric pressure on the piston head 190 exceeds the downward pressures exerted by the internal chamber pressure and gravity, each individual lift pin 110 will begin to rise. Although some bellows may exert a spring tension as the bellows is expanded, the spring tension may be overcome by continuing to evacuate the chamber to further decrease the internal pressure of the chamber.

In this manner, the lift pins may be raised independently until the engagement surface 122 of each lift pin 110 engages the alignment surface 116 of the chamber as shown in FIG. 6. This position is the position at which a wafer 106 carried on the lift finger tip 172 will be closest to the underside of the cooling plate 154. This position represents physical position "0", that is, the highest possible position of the lift pin 110. In the illustrated embodiment, it is preferred that the vertical movement of each lift pin 110 as represented by the direction arrow 242, be orthogonal to the alignment surface 116 of the chamber. However, should there be a degree of angular misalignment between the lift pin and the alignment surface, it is preferred that the engagement surface 122 of the lift pin 100 be spherical in shape to reduce possible damage to the alignment surface 116. It is recognized that the engagement surface 122 may have other shapes including parabolic and other curved shapes.

Once each lift pin has securely engaged the associated alignment surface 116, each lift pin 110 may be secured to the linking mechanism 112 so that the motor 114 can lower the lift pins from physical height 0 to other heights including the fully retracted position illustrated in FIGS. 1 and 2 and an intermediate transfer position. In the illustrated embodiment, the linking mechanism 112 preferably includes a float joint 124 which has a threaded stem 246 threaded into a threaded cavity 248 at the bottom end of the piston shaft 192. The float joint 124 also has a generally cylindrical body 250 around which a semi-circular clamp 252 can clamp the float joint 124 to the linking member 126 of the linking mechanism 112 as shown in FIG. 4. It is recognized that the float joint 124 may be attached to the lift pin 110 and the link member 126 using a variety of other releasable couplers and fasteners. Suitable float joints, also often referred to as cylinder joints, are available commercially from several sources including the SMC floating joint model series JA, JAH and JB; and the Humphrey cylinder joint model HCJ.

It is preferred that the vertical movement of the linking member 126 of the linking mechanism 112 move the cylindrical body 250 of the float joint 124 in a vertical direction as represented by an arrow 253 which is coaxial with the lift pin vertical movement as represented by the arrow 242. However, due to various misalignments, the linking member 126 may shift laterally or angularly as the linking member 126 is raised and lowered by the motor. The float joint 124 can accommodate a degree of this lateral and angular shifting as the float joint moves vertically because the cylindrical body 250 can slide eccentrically with respect to the stem 246 as represented by the eccentric or lateral direction arrow 254, and can also deflect radially or angularly, as represented by the angular direction arrow 256.

A float joint typically includes a ball and socket joint in which the ball portion is enclosed within the cylindrical body 250 which provides a clamping surface for the clamp 252. In the illustrated embodiment, it is preferred that the ratio L/D of the length L of the cylindrical surface of the body 250 to the diameter D of the cylindrical body 250 be at least 1 and more preferably greater than 1.5. It is recognized that the body 250 enclosing the ball of the float joint may have other shapes as well but it is preferred that the length to width ratio of the joint body which is fastened to the link member, be at least 1 and more preferably greater than 1.5.

As best seen in FIGS. 3 and 4, the linking member 126, which may also be referred to as a spider 126, includes a central portion 300 from which four spaced legs 302 radially extend. The cylindrical body 250 of each of the float joints is clamped by a clamp 252 to the end of each leg 302. The linear guide 115 of the motor 114 is attached to one side 304 of the central portion 300 of the linking member 126 by suitable fasteners so that actuation of the motor 114 causes the linking member and hence the lift pins 110 to raise and lower in accordance with the control signals provided to the motor 114 by the system controller 140 (FIG. 1). The motor 114 may be a conventional stepper motor which includes a drive screw or other types of motors including pneumatic motors. The linear guide 115 may be conventional as well. The system controller 140 is a programmed workstation in the illustrated embodiment, Other types of controllers included dedicated circuitry may be used as well.

The linking member 126 has an additional pair of platform legs 306 to which the pressure cylinders 128 are attached. Each pressure cylinder 128 has a piston shaft 310 (FIG. 3) which passes through an aperture 312 in each platform 306. The end of each pressure cylinder piston shaft 310 is coupled by a float or cylinder joint 314 (similar to the float joints 124) to the underside of the chamber bottom wall 200.

As noted above, each piston 120 of the lift pins 110 provides an upward force on the linking member 126 as a result of the net pressure differential between the internal chamber pressure and the ambient atmospheric pressure external to the chamber. This upward force produced by the ambient atmospheric pressure on the lift pins 110 is opposed by the motor 114, particularly when the motor 114 is directed to lower the lift pins 110. To counter-balance the upward force produced by the ambient atmospheric pressure on the lift pins 110, the pump 130 (FIG. 1) can provide air or other fluid under pressure to the pressure cylinders 128 to produce a downward directed force on the linking member 126 of the linking mechanism 112.

The magnitude of the downward force can be controlled by controlling the pressure of the fluid supplied to the pressure cylinders 128. In one embodiment, the downward force provided by the pressure cylinders may be maintained relatively constant at a first value when raising the pins 110 and at a second, larger substantially constant value when lowering the pins 110. Thus, for example, in the illustrated embodiment, the pressure regulator 132 controlled by the system controller 140 can maintain the pressure to the pressure cylinders 128 substantially constant at a first value such as 10 p.s.i. (0.7 kilogram-force per square centimeter ($kgf/cm^2$)), when raising the lift pins 110. Conversely, the pressure is maintained substantially constant at a second value, such as 20 p.s.i. (1.4 $kgf/cm^2$) for example, which is higher than that of the first pressure value, when lowering the lift pins. The pressure cylinders may be omitted in some applications. However, a larger motor may be appropriate where counter balancing pressure cylinders are not utilized.

The linking member 126 may be formed of a single integral piece of a strong, light-weight material such as aluminum or steel. Alternatively, the linking member may be assembled from component pieces. In the illustrated embodiment, the linking member 126 has a large central aperture 320 to permit various external components attached to the chamber to pass through. The legs 302 and 306 are shown arranged in opposing pairs to facilitate balancing the linking member. Other shapes may be utilized, depending upon the particular application including the number of motors, guides, lift pins and pressure cylinders coupled to the linking member.

As best seen in FIGS. 4 and 6, it is preferred that the drive force applied by the motor (and the pressure cylinders if included) via the linking mechanism to the shafts 192 of the lift pins 110, be aligned with the lift pin fingers 170. In the illustrated embodiment, the float joint 124, piston shaft 192 and the lift finger base portion 206 are substantially coaxially aligned to provide such alignment. It is recognized that satisfactory alignment may be achieved in some applications in which the alignment is less than coaxial.

The processing chamber of the illustrated embodiment has been described as an anneal chamber in which a workpiece is heated and then cooled. However, the present inventions are applicable to a variety of other semiconductor fabrication processes. For example, in the manufacture of many electronic or electrical components such as integrated circuits, there is a need to deposit thin films on various workpieces such as substrates. Materials such as copper, aluminum, titanium, tungsten, tantalum, tantalum nitride, cobalt, and silica may be deposited on ceramic, glass or silicon-derived substrates using physical vapor deposition (PVD) processes such as a physical sputtering process. Another method of deposition of solid materials upon a substrate is chemical vapor deposition (CVD), wherein a solid material is deposited from a gaseous phase onto a substrate by means of a chemical reaction. The deposition reaction involved is generally thermal decomposition, chemical oxidation, or chemical reduction. The CVD process can be used to deposit many elements and alloys as well as compounds including oxides, nitrides and carbides. The thin film deposited may be subsequently etched or otherwise fabricated into circuits and/or other electrical components. The workpieces may be transferred from one chamber to another for the various processing steps. The present inventions are applicable to each of the above-described processes as well as others used in the fabrication of semiconductor devices in which a workpiece is to be lifted.

It will, of course, be understood that modifications of the illustrated embodiments, in their various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments described herein but should be defined by the appended claims and equivalents thereof.

What is claimed is:

1. A semiconductor processing system, comprising:
   a vacuum chamber having an interior adapted to maintain an internal chamber pressure below ambient atmospheric pressure;
   a pump coupled to said chamber and adapted to reduce said internal chamber pressure to a pressure below ambient atmospheric pressure;
   a workpiece support adapted to support a workpiece having an underside;
   an alignment member disposed above said workpiece support and having an alignment surface;
   a plurality of lift pins, each lift pin having an engagement surface adapted to engage said alignment surface, and each lift pin also having piston means, responsive to the difference between said internal chamber pressure and said ambient atmospheric pressure, for elevating each lift pin from a first position to a second extended position in which each lift pin engagement surface engages said alignment surface;
   wherein the height of each lift pin within said chamber is a function of the difference between said internal chamber pressure and said ambient atmospheric pressure so that each lift pin is elevated from said first positions to said second extended positions as said pump reduces said internal chamber pressure.

2. The system of claim 1 wherein each lift pin piston means includes a shaft, said system further comprising a linking means for linking said lift pin piston means shafts together after each lift pin engagement surface engages said alignment surface, and motor means coupled to said linking means for elevating said lift pins between said first position and a third extended position below said second extended position.

3. The system of claim 2 wherein said linking means includes a plurality of floating joint means coupled to each of said piston means shafts, each floating joint means providing for flexible coupling to an associated piston means shaft wherein said flexible coupling includes angular deflection and eccentric sliding.

4. The system of claim 2 wherein said piston means provides an upwardly directed force on said linking means, said system further comprising fluid source means for providing fluid at a controllable fluid pressure and downward pressure means, responsive to said fluid source means and coupled to said linking means, for providing a downwardly directed force as a function of said controllable fluid pressure to at least partially counter-balance said piston means force.

5. A semiconductor processing system, comprising:
   a vacuum chamber having an interior adapted to maintain an internal chamber pressure below ambient atmospheric pressure;
   a pump coupled to said chamber and adapted to reduce said internal chamber pressure to a pressure below ambient atmospheric pressure;
   a workpiece support adapted to support a workpiece having an underside;
   a plurality of lift pins;
   linking means for linking said lift pins together wherein each lift pin has upward pressure means, responsive to the difference between said internal chamber pressure and said ambient atmospheric pressure, for providing an upwardly directed force on said linking means;
   fluid source means for providing fluid at a controllable fluid pressure;
   downward pressure means, responsive to said fluid source means and coupled to said linking means, for providing a downwardly directed force as a function of said controllable fluid pressure, to at least partially counter-balance said upwardly directed force; and;
   motor means coupled to said linking means, for elevating said lift pins between a first position and an extended position.

6. The system of claim 5 wherein said motor means includes a stepper motor and a linear guide coupling said motor to said linking means.

7. The system of claim 5 wherein each lift pin upward pressure means includes a shaft and wherein said linking means includes a plurality of floating joint means coupled to each of said upward pressure means shafts, each floating joint means providing flexible coupling to an associated shaft wherein said flexible coupling includes angular deflection and eccentric sliding between an associated shaft and said linking means.

8. A semiconductor processing system, comprising:
   a vacuum chamber having an interior adapted to maintain an internal chamber pressure below ambient atmospheric pressure;
   a pump coupled to said chamber and adapted to reduce said internal chamber pressure to a pressure below ambient atmospheric pressure;
   a workpiece support adapted to support a workpiece having an underside;
   a plurality of lift pins adapted to engage the underside of said workpiece, each lift pin being adapted for vertical movement between a first position and a second extended position; and
   an alignment member having an alignment surface positioned to be engaged by each of said plurality of lift pins when each lift pin is in its associated extended position;
   wherein each lift pin includes a piston adapted for slidable vertical movement and exposed to internal chamber pressure on a first side of said piston, each lift pin further including a piston chamber which encloses a second side of said piston opposite said first side, said piston chamber being vented to the exterior of said processing chamber so that piston second side is exposed to ambient atmospheric pressure;
   said system further comprising a controller coupled to said pump and adapted to activate said pump to evacuate said processing chamber to reduce said internal chamber pressure on said first side of said pistons relative to said ambient atmospheric pressure on said second side of said pistons to drive each of said pistons of said lift pins upward toward said engagement surface of said chamber.

* * * * *